United States Patent
Koehn et al.

(10) Patent No.: US 7,875,860 B2
(45) Date of Patent: Jan. 25, 2011

(54) CHARGED PARTICLE BEAM PROFILE MEASUREMENT

(75) Inventors: Jason Andrew Koehn, Seattle, WA (US); Dennis A. Russell, Edmonds, WA (US)

(73) Assignee: The Boeing Company, Chicago, IL (US)

( * ) Notice: Subject to any disclaimer, the term of this patent is extended or adjusted under 35 U.S.C. 154(b) by 151 days.

(21) Appl. No.: 12/284,193

(22) Filed: Sep. 19, 2008

(65) Prior Publication Data

US 2010/0072392 A1    Mar. 25, 2010

(51) Int. Cl.
  *H01J 37/244* (2006.01)
  *H01J 49/00* (2006.01)
(52) U.S. Cl. .................. 250/397; 250/398; 250/299; 250/283; 250/396 R; 250/489
(58) Field of Classification Search ........... 250/397, 250/398, 299, 283, 396 R, 489
See application file for complete search history.

(56) References Cited

U.S. PATENT DOCUMENTS

| 5,198,676 | A | 3/1993 | Benveniste et al. |
| 6,507,033 | B1 * | 1/2003 | Musket et al. ......... 250/492.21 |
| 7,282,709 | B2 * | 10/2007 | Darling et al. ............. 250/299 |
| 2004/0262533 | A1 | 12/2004 | Krueger |
| 2008/0073553 | A1 | 3/2008 | Blake et al. |
| 2008/0073584 | A1 * | 3/2008 | Callahan et al. ........ 250/492.21 |
| 2008/0142727 | A1 | 6/2008 | Ryding et al. |
| 2010/0001204 | A1 * | 1/2010 | White ....................... 250/398 |

* cited by examiner

*Primary Examiner*—Nikita Wells

(57) ABSTRACT

According to an embodiment, an apparatus for measuring the uniformity of a beam of charged particles at an exposure location includes a plurality of Faraday cups, each cup including an electrometer for determining the current collected by said cup, at least one multi-channel low current scanner card electrically coupled to the electrometers, a processor electrically coupled to said at least one scanner card, computational analysis software for receiving signals from said processor and calculating beam parameters, and display software for generating a graphical representation of the beam parameters calculated by said computational analysis software.

22 Claims, 2 Drawing Sheets

CHARGED PARTICLE BEAM PROFILE MEASUREMENT

FIELD OF THE DISCLOSURE

The present disclosure is directed to a method and apparatus for measuring and controlling various parameters of an ion beam, and more particularly to a method and apparatus for obtaining quantitative data regarding position and amplitude of an accelerated electron or positive ion beam and processing the data to obtain visual feedback and to permit momentary or continuous measurement and display of beam uniformity, beam flux and other beam properties useful in subsequent control of the beam.

BACKGROUND OF THE DISCLOSURE

Techniques and equipment for ion beam measurement useful in controlling various aspects of the beam have been developing over some time. Among the more commonly used equipment are grid harps and Faraday cups. Each has its own unique construction, and both are used in a variety of applications, principally in connection with testing or manufacturing methods.

A grid harp is a device for measuring intensity distribution of an accelerated ion or electron beam principally in two transverse directions. A grid harp typically includes a frame member having an opening of orthogonal dimensions x and y, through which the beam passes and across which is disposed a grid of wires consisting of a first set of wires in the x direction and a second set of wires in the y direction. Wires used for the x and y planes collect charged particles, and the collected charge is then converted to a value representing an intensity level. The array of wires then produces a thin cross-sectional mapping of the intensity level at various points in the beam. By using a greater number of wires, more precise measurements can be obtained. For particles having a range which is greater than the thickness of harp wires themselves, secondary electrons can be measured.

However, grid harps tend to be very expensive, require extensive modifications of the accelerator beam line, and measurements using grid harps tend to be time consuming and often yield incomplete data. Further, measurement systems using grid harps also require a compressed air actuated, high vacuum feedthrough, and complex processing electronics.

A Faraday cup is a detector that measures, at a fixed location, the current in a beam of charged particles. Faraday cups are typically used in arrays for various applications, and have the advantage of being robust and able to measure an ion or electron stream absolutely. In its simplest form, a Faraday detector would consist of a metal cup or housing mounted on an insulator. The cup would be placed in the path of the particle beam, and an electrical lead is attached which conducts the current to a measuring device.

A Faraday cup is typically connected to an electrometer to measure the current of the charged particles collected by the cup. According to Gauss' Law, the charge collected on the Faraday cup is the induced charge. Faraday cups are highly regarded for accuracy because of the direct relation between the measured current and the number of ions.

When using an ion beam, it is desirable to have the ability to measure properties of the beam, such as its density, its position and orientation, its diameter, etc. Various methods and software for accomplishing this are known in the art, but their use is typically undesirable due to inaccuracies and time consuming procedures. Further, many of these methods rely on processes that produce strictly analytical information which can only be subjectively interpreted.

It would therefore be highly desirable to have a method and apparatus for measuring properties of an ion beam at selected locations that would reliably yield data that could be used as feedback for subsequent control and shaping of the beam to attain continuously desired properties either manually or automatically.

Further it would be highly desirable to have a method and an apparatus that would measure ion beam properties and yield visual information directly correlated to such properties which could be used in the adjustment of various beam attributes.

SUMMARY OF THE DISCLOSURE

The present disclosure provides a method and apparatus for quantitatively determining properties of an ion or electron beam and then providing analytical data useful in observing and, if necessary, adjusting the beam.

According to one exemplary embodiment, an apparatus for measuring the uniformity of a beam of charged particles at an exposure location includes a plurality of Faraday cups, each cup including an electrometer for determining the current collected by said cup, at least one multi-channel low-current scanner card electrically coupled to the electrometers, a processor electrically coupled to said at least one scanner card, computational analysis software for receiving signals from said processor and calculating beam parameters, and display software for generating a graphical representation of the beam parameters calculated by said computational analysis software. As used herein, the term exemplary indicates an example and not necessarily an ideal.

According to another embodiment, a method for continuously monitoring ion beam position and intensity includes arranging an array of Faraday cups in an exposure plane in the path of the beam, connecting current measuring apparatus to said array of cups, measuring current values associated with said cups, calculating beam properties including beam uniformity, beam uniformity error, and statistical property values associated with the beam, and displaying the calculated beam properties in a 3-dimensional graphic format.

According to still another embodiment, a visual-aid tool useful in tuning a beam of charged particles at an exposure plane includes an array of Faraday cups mounted on a substrate at the plane, charge measuring devices coupled with each cup in the array for determining the current collected by said cup, low current sensor apparatus coupled to the charge measuring devices and configured to produce an output signal, a processor electrically configured to receive the output signals and produce a plurality of processor signals, computational analysis software executing on the processor for receiving the processor signals and calculating beam parameters, display software executing on the processor for generating a graphical representation of the beam parameters calculated by the computational analysis software, a display device for viewing the graphical representation, and a graphical user interface coupled between the display software and the display device.

Further aspects of the system and the method of using the system and processing the information obtained through use of the system and method are disclosed herein. The features as discussed above, as well as other features and advantages of the present disclosure will be appreciated and understood by those skilled in the art from the following detailed description and drawings.

DETAILED DESCRIPTION OF THE DISCLOSURE

Embodiments of the present invention now will be described more fully hereinafter with reference to the accompanying drawing. However, many different embodiments are contemplated and the present disclosure should not be construed as limited to the embodiments set forth herein; rather, these embodiments are provided so that this disclosure will be thorough and complete and better convey the scope of the disclosure to those skilled in the art.

Figure 1:
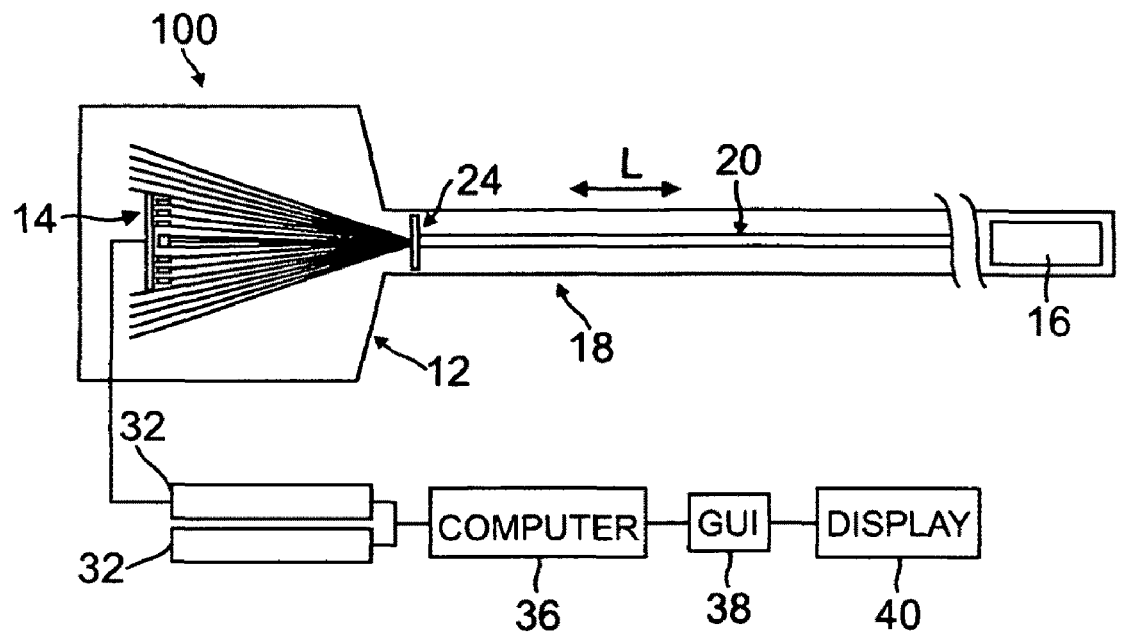
FIG. 1 is a schematic diagram showing an apparatus according to an embodiment of the present invention.
Figure 2:
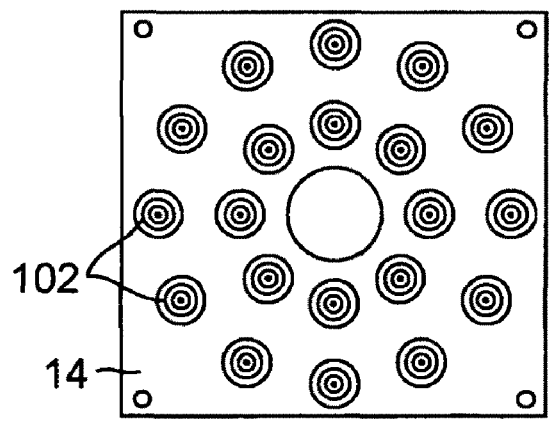
FIG. 2 is a front view showing a preferred arrangement of Faraday cups in an array, according to an embodiment.

FIG. 1 depicts the system 100 that shows a structure including a test chamber 12 within which an article to be tested (not shown) can be placed as well as a charge collecting apparatus 14, an accelerator or ion source 16, and a beam tube 18 through which a charged particle beam 20 created by the ion source or generator 16 is directed. The ion source or generator 16 is located upstream of a scattering foil 24 or other similar mechanism for scattering the beam 20, such as beam raster system. Downstream of the scattering foil, at a chosen location in the test chamber, is the charge collecting apparatus 14 comprising a substrate on which is arranged an array of Faraday cups 102 (see FIG. 2 for details). The substrate to which the cups 102 are mounted may comprise Macor, and the array of cups may comprise two circular sets. The first array of cups preferably comprises eight in number and is located in near vicinity to a central opening 104 provided in the Macor substrate. The second array of cups preferably comprises twelve in number, and is arranged outwardly of, and about, the first array of cups. The number of cups used is dependent on such things as the size of the accelerator, the number of available scanner channels, the desired area of exposure, and the size of the Faraday cups used. When selecting the size of the Faraday cups being used, it is important to take into account that smaller cups can limit the sensitivity of the system due to the fact that such smaller cups cannot capture enough particles, and a very sensitive measuring device would be required. The charge in each cup is measured by electrometers. Conductive elements extending from the electrometers associated with the cups mounted on the substrate are each electrically wired to a respective separate scanner card channel. While the embodiment depicted in FIG. 2 includes a pair of scanner cards 32, a single scanner card can be used provided it has enough channels to accommodate the number of cups being used. The scanner cards are of a multi-channel low current type that may be installed with the necessary number of electrometers. The scanner cards are electrically coupled to a computer processor 36 so that various statistical and other types of calculations can be made from the collected charge values.

Current in each array of the Faraday cups is measured by an off the shelf multi-channel current measuring device that has the capability to scan through its channels rapidly. This is accomplished via remote control using a computer. The software in the computer (see FIG. 3 and description below) then calculates the maximum reading from the array, divides all of the other readings by that maximum to normalize the readings, and changes the resulting data to percent, thereby yielding an array of data that is in "percent of maximum" units. This array of data is then fed into a cubic spline interpolation routine that interpolates many other data points in between the known points in order to "fill in the gaps" to create a smooth three-dimensional (3-D) surface map. The 3-D surface may then be displayed for a user with a graphical user interface (GUI) 38, such as on a display device 40. All of these operations are done every time the current in the array of cups is measured (many times per second) in order to give a near real-time cross-sectional view of the beam intensity impacting the array of cups. At any time during operation of the ion beam generating apparatus, the scanning system can be activated to read the current from each individual cup and record the current reading.

The array of Faraday cups located within the test chamber is arranged at a substantially planar intersection with the scattered beam particles such that the charged particles are captured by the receptacle portions of the cups. Most applications will involve arranging the array of cups substantially perpendicular to the beam axis L. Besides the more conventional applications of ion beams, such as material deposition or abrasion, the disclosure also contemplates an application of the beam in which the effects of radiation conditions in outer space are determined on different materials over the life cycle of use in space. In achieving this outcome, the cup array and the tested material could be situated in the test chamber at the same planar location. This can be accomplished, for example, by using a tray or similar structure on which the material to be tested and the cup array are mounted. The tray could then be made rotatable about an axis substantially parallel to the axis of the beam in the beam tube. Rotation of such tray structure could enable both the material to be tested and the cup array to be inserted into the path of the scattered beam.

The signal output of the scanner cards is fed to a computer processor where various functions are performed and results obtained. The resulting processor output can then be stored in a library for later review either as raw data or in graphical representation, or it can be used in a graphical format as a visual aid tool in connection with a method and apparatus for altering the beam to achieve desired properties.

Figure 3:
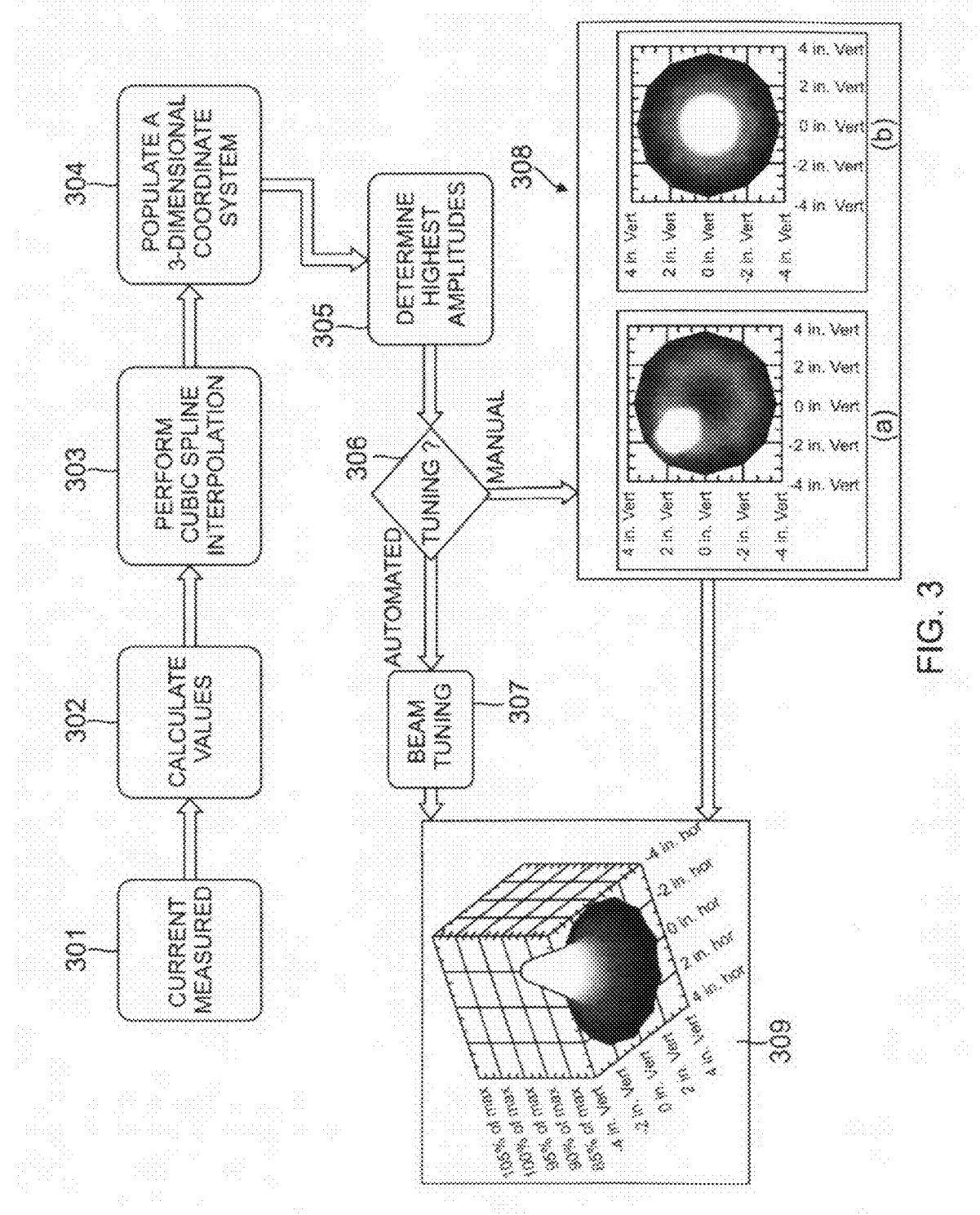
FIG. 3 is a block diagram showing the logic of the process steps performed in a method according to an embodiment.

FIG. 3 shows the steps of the method logic carried out in the analysis of data obtained using a cup array of the present disclosure. In the first step of the logic (block 301), the current value at each cup in the array is obtained using the scanner cards. This current value collection step occurs at the rate of one measurement (for all cups) in less than 500 milliseconds. In the next logic step (block 302), values associated with the most recent measurements at the cups in the array are calculated. These values, which represent the most recent measured beam properties, include (but are not limited to) maximum, minimum, and mean current values, beam uniformity values, and beam uniformity error values. These values are continuously updated while the apparatus is running.

The logic step associated with block 303 entails performing a cubic spline interpolation on the beam uniformity value. This step may be performed with a user selectable resolution. A cubic spline interpolation is a mathematical calculation that determines a "Z" value for each of the unknown "X" and "Y" coordinates associated with the points that lie in the plane of scanning that are not associated with the actual number of Faraday cups being used. In the embodiment shown herein, having 20 Faraday cups means there are 20 known XY coordinates each with an associated known Z value. The "resolution" refers to the number of increments used between known X and Y coordinates (that is to say, for how many unknown X and Y points a Z value will be calculated) for which an interpolated Z value is calculated.

Block 304 represents a step of taking the interpolated information and correlating it with a three-dimensional (3-D) coordinate system. The X and Y values are locations in the plane of exposure. These location include those that represent the location of the cups, as well as those that have been interpolated at the cubic spline calculation of block 303. The Z value at each of the interpolated locations is the interpolated beam intensity value that represents the amplitude of current at each interpolated points other than the points representing the locations of the cups. A standard color mapping routine can be associated with these values to aid in viewing the information when presented as a graphic representation.

At block 305, the spatial location, determined by X and Y coordinates, of the highest amplitude point, and a predetermined area thereabout representing a range of diminishing amplitudes, are determined.

At block 306, the logic determines whether tuning of the beam is to be made manually by a human operator or automatically by beam tuning apparatus (not shown). If the tuning will be carried out in an automated manner, the information determined at block 306 is fed to a beam tuning apparatus (block 307) which converts the data into appropriate instructions for manipulating the region of peak intensity (that is, the region of greatest amplitude of current) to a desired point of focus. Most often, the beam tuning apparatus uses, for example, steering and focusing magnets, and the instructions guide appropriate beam control components to achieve placement of the portion of the beam with the greatest intensity at the center of the cup array. If the tuning is to be carried out by a human operator, the information produced in the process of block 306 is displayed in a two-dimensional graphic representation (such as is shown in block 308a and 308b) to be used by the operator as a visual aid in manipulating apparatus controls to move that portion of the beam with the greatest intensity to the center of the array of cups. The graphic representation depicted in block 308a typically would indicate that the portion of the beam with the greatest intensity (that is, the region of the beam indicated as a brighter and lighter area in the graphic representation of block 308a) is located in the northwest quadrant of the cup array. Using the display of block 308a and the beam steering mechanisms of the tuning apparatus, an operator would be able to move that lighter portion of the beam exhibiting the greatest intensity to a more central location, such as has been depicted in block 308b.

Upon completion of attaining a desired placement of the portion of the beam exhibiting the greatest intensity within the array of cups, a three-dimensional graphic representation is generated (block 309) and stored for later review or for archival purposes. The data in block 309 is typically expressed as a percentage of the maximum measured current intensity at the sample exposure plane.

It will be understood by those skilled in the art that various changes may be made and equivalents may be substituted for elements thereof without departing from the scope of this disclosure. In addition, many modifications may be made to adapt a particular situation or material to the teachings of the disclosure without departing from the essential scope thereof. Therefore, it is intended that this disclosure not be limited to the particular embodiment disclosed as the best mode contemplated for carrying out this invention, but that the disclosure will include all embodiments falling within the scope of the appended claims.

The invention claimed is:

1. Apparatus for measuring the uniformity of a beam of charged particles at an exposure location, comprising:
    a plurality of Faraday cups, each said cup including an electrometer for determining the current collected by said cup,
    a plurality of low current sensors, each sensor being coupled to an associated electrometer and configured to produce a sensor output based on the current collected,
    a processor electrically configured to receive the sensor outputs and produce a plurality of processor signals,
    computational analysis software executing on the processor for receiving the processor signals and calculating beam parameters, and
    display software executing on the processor for generating a graphical representation of the beam parameters calculated by said computational analysis software.

2. The apparatus of claim 1, and further comprising a data storage unit to store processor signals and calculated beam parameters.

3. The apparatus of claim 2, wherein calculations of beam parameters are performed at any given time and then stored in said storage unit for review at a later time.

4. The apparatus of claim 1, and further comprising a graphical interface coupled between said computational software and said display software to provide visual feedback useful in tuning the beam.

5. The apparatus of claim 1, wherein said computational software continuously performs calculations of beam parameters to achieve updated information indicating real-time behavior of the beam.

6. The apparatus of claim 1, wherein said cups comprise an array of two concentric sets of evenly spaced apart cups mounted on a ceramic substrate.

7. The apparatus of claim 6, wherein the inner set of cups comprises eight in number and the outer set of cups comprises twelve in number.

8. The apparatus of claim 7, wherein said inner and outer sets of cups are each arranged in a circular pattern.

9. The apparatus of claim 6, wherein said substrate is planar and arranged at an exposure plane so that the X and Y coordinates of said cups relative to the beam are known and parameters of the beam along a Z axis can be determined.

10. A method for continuously monitoring ion beam position and intensity, comprising:
    arranging an array of Faraday cups in an exposure plane in the path of the beam,
    electrically connecting current measuring apparatus to said array of cups,
    measuring current values associated with said cups using said current measuring apparatus,
    calculating beam properties including beam uniformity, beam uniformity error, and statistical property values associated with the beam, and
    displaying the calculated beam properties in two-dimensional and three-dimensional graphic formats.

11. The method of claim 10, wherein said step of measuring current values associated with said cups further includes scanning the current measurements at said current measuring apparatus.

12. The method of claim 10, wherein said step of calculating includes performing a cubic spline interpolation on the beam uniformity data to determine Z values of beam intensity.

13. The method of claim 12, and further including the step of associating a color code with said interpolated data to assist in viewing the information displayed in said three-dimensional graphic format.

14. The method of claim 10, and further including, in connection with a beam tuning process, the step of determining whether beam tuning is to take place one of manually and automatically.

15. The method of claim 14, wherein, if said tuning is to be performed automatically, continuously repeating the steps of scanning, calculating, and displaying until said tuning is ended.

16. The method of claim 15, and further including a step of calculating a maximum beam intensity value and position coordinate values associated with said maximum beam intensity value, and then inputting said values to beam control apparatus so that beam tuning can take place automatically.

17. The method of claim 16, wherein the step of inputting values to beam control apparatus includes adjusting the location of the beam so that the maximum intensity of the beam is positioned centrally of the array of cups.

18. The method of claim 17, and further including, for each round of calculations, the step of storing values associated with maximum beam intensity and the X,Y,Z coordinates associated with maximum beam intensity.

19. The method of claim 14, and further including a step of calculating a maximum beam intensity value and position coordinate values associated with said maximum beam intensity value, and then displaying said maximum beam intensity value and said position coordinate values on said 3-dimensional graphic format so that an operator can manually make adjustments to beam control apparatus to re-center the beam and alter its intensity.

20. The method of claim 19, and further including, for each round of calculations, the step of storing values associated with maximum beam intensity and the X,Y,Z coordinates associated with maximum beam intensity.

21. A visual-aid tool useful in tuning a beam of charged particles at an exposure plane, comprising:
  an array of Faraday cups mounted on a substrate at the plane,
  charge measuring devices coupled with each cup in the array for determining the current collected by said cup,
  low current sensor apparatus coupled to said charge measuring devices and configured to produce an output signal,
  a processor electrically configured to receive the output signals and produce a plurality of processor signals,
  computational analysis software executing on the processor for receiving the processor signals and calculating beam parameters,
  display software executing on the processor for generating a graphical representation of the beam parameters calculated by said computational analysis software,
  a display device for viewing said graphical representation, and
  a graphical user interface coupled between said display software and said display device.

22. The visual-aid tool of claim 21, wherein said computational software includes a cubic spline interpolation routine for determining intensity properties of locations between each of the known cup locations, and said display software generates a three-dimensional representation of calculated data including beam current intensity at said known cup locations and said interpolated locations.

\* \* \* \* \*